United States Patent [19]

Nishimura et al.

[11] Patent Number: 5,437,915
[45] Date of Patent: Aug. 1, 1995

[54] SEMICONDUCTOR LEADFRAME AND ITS PRODUCTION METHOD AND PLASTIC ENCAPSULATED SEMICONDUCTOR DEVICE

[75] Inventors: Asao Nishimura, Ushiku; Akihiro Yaguchi; Mitsuaki Haneda, both of Ibaraki; Ichiro Anjoh, Koganei; Junichi Arita, Musashino; Akihiko Iwaya, Kokubunji; Masahiro Ichitani, Kodaira, all of Japan

[73] Assignee: Hitachi, Ltd., Tokyo, Japan

[21] Appl. No.: 261,230

[22] Filed: Jun. 16, 1994

Related U.S. Application Data

[63] Continuation of Ser. No. 5,036, Jan. 15, 1993, abandoned.

[30] Foreign Application Priority Data

Jan. 17, 1992 [JP] Japan .................................. 4-006522

[51] Int. Cl.[6] .............................................. B32B 9/00
[52] U.S. Cl. .................................. 428/209; 428/901; 361/813; 361/807
[58] Field of Search ........................ 428/209, 210, 901; 437/209, 215, 217, 221, 224; 361/517, 518, 813, 807, 809, 812; 257/735

[56] References Cited

U.S. PATENT DOCUMENTS

| | | | |
|---|---|---|---|
| 4,445,271 | 5/1984 | Grabbe | 437/220 |
| 4,920,074 | 4/1990 | Shimizu et al. | 361/421 |
| 4,987,473 | 1/1991 | Johnson | 257/666 |
| 5,049,527 | 9/1991 | Merrick et al. | 361/421 |
| 5,147,815 | 9/1992 | Casto | 437/220 |

FOREIGN PATENT DOCUMENTS

| | | | |
|---|---|---|---|
| 209119 | 12/1983 | Japan | 361/421 |
| 102549 | 5/1987 | Japan | 257/666 |
| 045967 | 2/1990 | Japan | 437/220 |

*Primary Examiner*—Patrick J. Ryan
*Assistant Examiner*—Patrick Jewik
*Attorney, Agent, or Firm*—Antonelli, Terry, Stout & Kraus

[57] ABSTRACT

A method of producing a leadframe for use in semiconductor devices, comprises the steps of forming a space between leads 1a and 1b which are to be overlapped and welded each other, and welding the leads at a region including the space and melting and cutting off one of the leads. In one of the leads which is melted, cohesion and separation of molten metal occur in the region around the space. As a result, unnecessary portions such as an outer frame used for positioning can be cut off at the same time when the leads are connected by welding. Thus, high precision positioning of a plurality of element leadframes as well as high assembling productivity are achieved.

4 Claims, 7 Drawing Sheets

SEMICONDUCTOR LEADFRAME AND ITS PRODUCTION METHOD AND PLASTIC ENCAPSULATED SEMICONDUCTOR DEVICE

This application is a Continuation application of application Ser. No. 005,036, filed Jan. 15, 1993, now abandoned.

BACKGROUND OF THE INVENTION

1. Field of the Invention

The present invention relates to a semiconductor device. More particularly, this invention relates to a leadframe for use in semiconductor device, composed of a plurality of stacked element leadframes, and to its production method which provides high assembling productivity. Furthermore, this invention relates to a plastic encapsulated semiconductor device comprising the above leadframe.

2. Description of the Prior Art

Leadframes used for plastic encapsulated semiconductor devices are each usually composed of leads for electrical connections, a tab for mounting a semiconductor chip on it, leads for supporting the tab, and an outer frame for supporting all of these elements, wherein all of these elements are formed in one sheet metal. In such a leadframe, only one layer is available for leads or a tab. Moreover, all these leads, tab and others must be formed using the same material. This results in restriction for semiconductor devices to achieve higher integration density or to improve their electrical, mechanical and thermal characteristics. A technology to solve this problem is disclosed in Japanese Patent Unexamined Publication No. 58-27347 and in "Proceedings of the 39th Electronic Components Conference", 1989, pp. 494–503. In this technology, respective parts of a leadframe are formed in a plurality of different thin metal sheets, then these sheets are placed one upon another and connected to each other to form one stacked leadframe or one plastic encapsulated semiconductor device.

The above referenced literatures do not describe any concrete method for combining plural element leadframes of thin metal sheets into one stacked leadframe. For the application to plastic encapsulated semiconductor devices having a large number of pins or small body size, precise positioning of the element leadframes is really required before combining them into one stacked leadframe. For this reason, it is more preferable to combine element leadframes in such a manner that the positioning is performed by using outer frames which will be cut away later from smaller main portions, compared to the manner that only small essential parts required for final plastic encapsulated semiconductor device are combined without using outer leadframes. For example, one method to achieve this is as follows: First, leads of plural element leadframes are bonded each other by brazing or electric resistance welding. Then, the outer frames of element leadframes except one leadframe is cut off. After that, plastic molding is carried out as in the conventional method of encapsulating semiconductor devices with plastic. However, this method needs an extra step of cutting off outer frames after bonding the element leadframes. Besides, in the case of plastic encapsulated semiconductor devices having a large number of pins whose pitch is narrow, it is difficult to insert an outer-frame cutting tool into spaces between leads.

SUMMARY OF THE INVENTION

It is an object of the present invention to provide a method of stacking and bonding a plurality of element leadframes into one stacked leadframe, which enables high precision positioning and high assembling productivity. It is another object of the present invention to provide a semiconductor device leadframe and a plastic encapsulated semiconductor device having high integration density and excellent electric, mechanical and thermal characteristics.

In order to achieve the above objects, the present invention provides a method of producing a leadframe for use in semiconductor devices, comprising steps of forming at least one lead in each of a plurality of element leadframes; placing the element leadframes one upon another so that the leads are overlapped each other; and welding the overlapped leads each other and at the same time cutting off one of the leads, wherein the leads are overlapped each other with a space formed in the widthwise direction of the lead interposed between the leads; and the leads are welded at a region including the space and at the same time one of the leads is cut off by melting.

Here, among the leads to be welded each other, the one lead which is to be cut off may have a portion at which the lead will be cut off and the portion may be narrower than the other portion of the lead.

Furthermore, among leads to be welded each other, the one lead which is to be cut off from the other portion of the lead may be narrower at a portion at which the lead will be cut off from the other portion, than the main portion where the welding is carried out.

The space may be formed by a thin portion formed in at least one of the leads.

The space may alternatively be formed by bending at least one of the leads.

The space may be formed by a thin portion formed in the lead which is not to be cut off.

The space may be formed by a thin portion formed approximately in the center of the width of the lead which will not be cut off.

The space may be also formed by a through-hall formed approximately in the center of the width of the lead which will not be cut off.

Welding may be performed by laser irradiation.

As another embodiment, the present invention provides a leadframe for use in semiconductor devices, formed by a process comprising the steps of forming at least one lead in each of a plurality of element leadframes; placing the element leadframes one upon another so that the leads are overlapped each other; and welding the overlapped leads each other and at the same time cutting off one of the leads, wherein the leads are overlapped each other with a space formed in the widthwise direction of the leads interposed therebetween; and the leads are welded at a region including the space and at the same time one of the leads is cut off by melting.

A plastic encapsulated semiconductor device in accordance with the present invention is formed by a process comprising the steps of placing a plurality of element leadframes one upon another, at least one of the leadframes having a semiconductor chip mounted thereon, welding leads of the element leadframes each other; and molding with a plastic the semiconductor chip and all portions of the leads except the portions which are to extend out of the molded plastic. The device comprises a leadframe formed by overlapping the leads each other with a space formed in the widthwise direction of the leads interposed between the leads; and the leads are welded at a region including the space and one of the leads is cut off by melting.

In accordance with the present invention, when leads are melted, one of the leads is bonded to the other lead at the portion where the one lead is in contact with the other, and the molten metal at a recessed portion coheres so that the one lead is cut off. Consequently, it is possible not only to bond one lead to the other, but also possible to cut off at the same time the unnecessary outer frame from the other necessary portion. Therefore, the element leadframes can be precisely positioned each other and then bonded together, and, at the same time unnecessary portions can be easily cut off without adding extra production processes.

As described above, in accordance with the present invention, a plurality of element leadframes can be positioned one to the other by outer frames and the leads are welded and cut off at the same time at the regions including the space. Thus, not only a high precision positioning but also a high assembling productivity are achieved in the process for assembling element leadframes into one stacked leadframe.

DESCRIPTION OF THE PREFERRED EMBODIMENTS

Referring to FIGS. 1-4, an embodiment of the present invention will be described.

Figure 1:
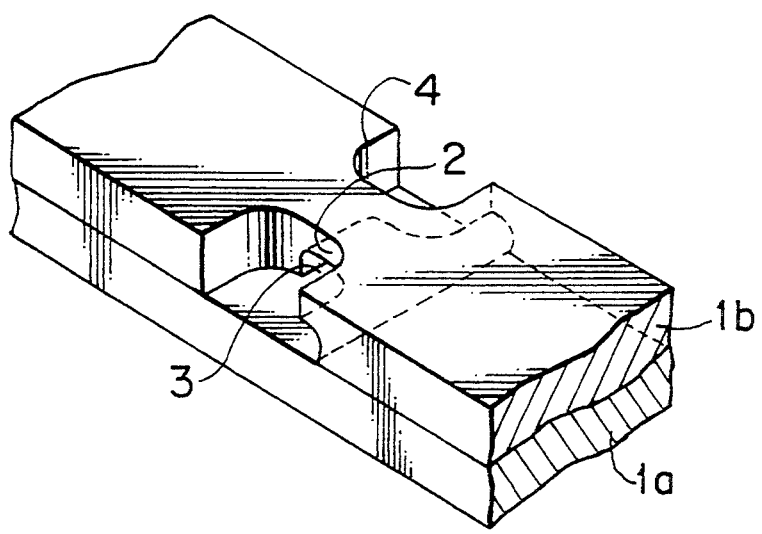
FIG. 1 is a fragmentary perspective view of an embodiment of the present invention.

FIG. 1 is a perspective view of an embodiment showing a state of the welding region of element leads placed one upon another prior to a welding step of a method for producing a leadframe for use in semiconductor devices according to the present invention. In FIG. 1 and also in all the other perspective views shown later, the portions of leads at the near right side are connected to outer frames not shown. Moreover, in these Figures, a lead 1a whose outer frame will remain after welding without being cut off is shown at the lower position and, on the other hand, the other lead 1b whose outer frame will be cut off after welding is carried out is shown at the upper position. Hereafter, these leads are referred to "non-cut-off lead" and "cut-off lead", respectively. A thin portion 2 is provided in the cut-off lead 1b, and the cut-off lead is placed so that the recessed portion of this thin portion 2 faces the non-cut-off lead to form a space 3 between these leads 1a and 1b. In the cut-off lead 1b, notches 4 are also formed by laterally cutting out the lead 1b at the portion which partially overlaps the thin portion 2. The thin portion 2 is located slightly nearer to the outer frame than the notches 4.

Figure 2:
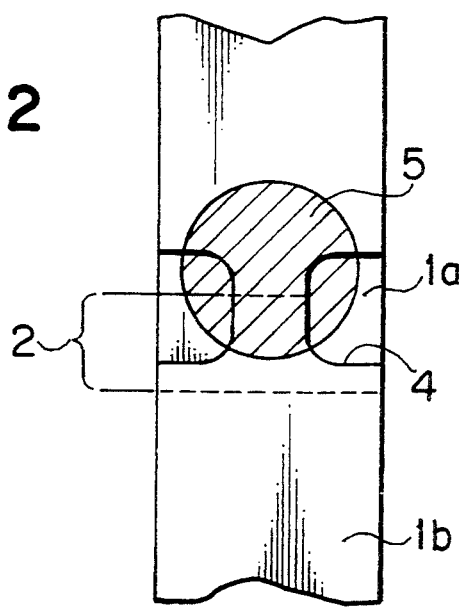
FIG. 2 is a plan view of the embodiment shown in FIG. 1.

FIG. 2 is a plan view of leads placed one upon another as shown in FIG. 1, for explanation of a method for welding these leads. In FIG. 2, the portions of leads connected to the outer frame are shown in the lower area of Figure. In the welding process, a laser irradiation region 5 represented by hatching lines in FIG. 2 is exposed to laser beam so that the leads are heated from above and melted. The laser irradiation region 5 includes a narrow portion, which is made narrow by the notches, and a wide portion adjacent to this narrow portion on the side opposite the outer frame, and furthermore includes a thin portion 2 in the region nearer to the outer frame of the leadframe. In the recessed area of the notches 4 excepting the thin portion 2 in the laser irradiation region 5, both of the cut-off lead 1a and non-cut-off lead 1b are heated by a laser beam and are in contact with each other, thus these leads are welded and bonded to each other. On the other hand, in the specific region of the laser irradiation region 5 which includes both of the thin portion 2 and the notches 4, the space 3 prevents the leads from being welded. Furthermore, the portion of the cut-off lead 1b in this region is melted and coheres into the wider portions on the both sides or on either one of sides, thus the cut-off lead 1b is cut off into two separated portions, a portion adjacent the outer frame portion and a portion on the opposite side.

Figure 3:
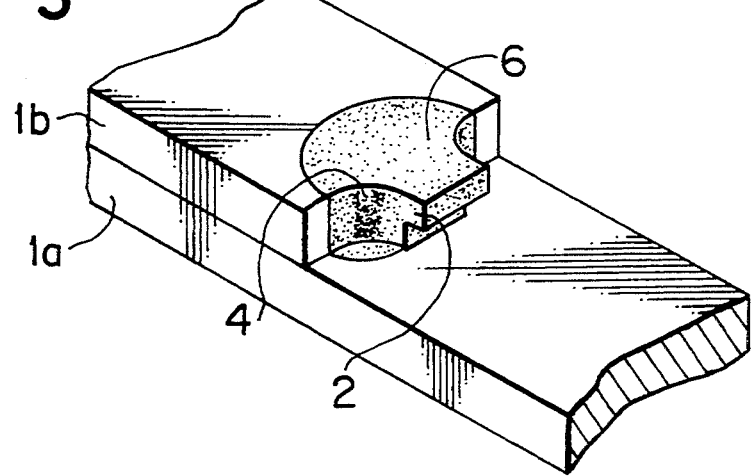
FIG. 3 is a perspective view showing an example of the shape of a bonded portion of leads obtained in accordance with FIG. 2.
Figure 4:
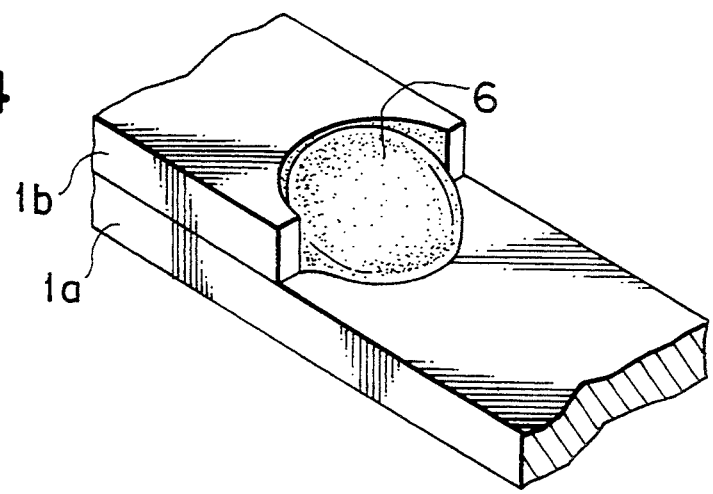
FIG. 4 is a perspective view showing another example of the shape of a bonded portion of leads obtained in accordance with FIG. 2.

FIGS. 3 and 4 are perspective views showing examples of the form of welded portion of the leads obtained in the manner described above. FIG. 3 shows an example of the form of the welded region obtained in the case where the welding is carried out with weak power laser, and FIG. 4 shows another example obtained in the case where laser power is strong. Both of these Figures show melted portions 6 melted during the welding process. In the cut-off lead 1b, the portion of the thin portion 2 adjacent the outer frame has been cut off. On the other hand, the region of recessed portions of the notches 4 located opposite the outer frame is welded and bonded to the non-cut-off lead 1a. In the case of FIG. 3, the thin portion 2 and the notches 4 in the laser irradiation region 5 of the cut-off lead 1b still maintain their previous shape. In contrast, in the case of FIG. 4, the portion of the laser irradiation region 5 of the cut-off lead 1b has been completely melted, resulting in a flat form.

Figure 5:
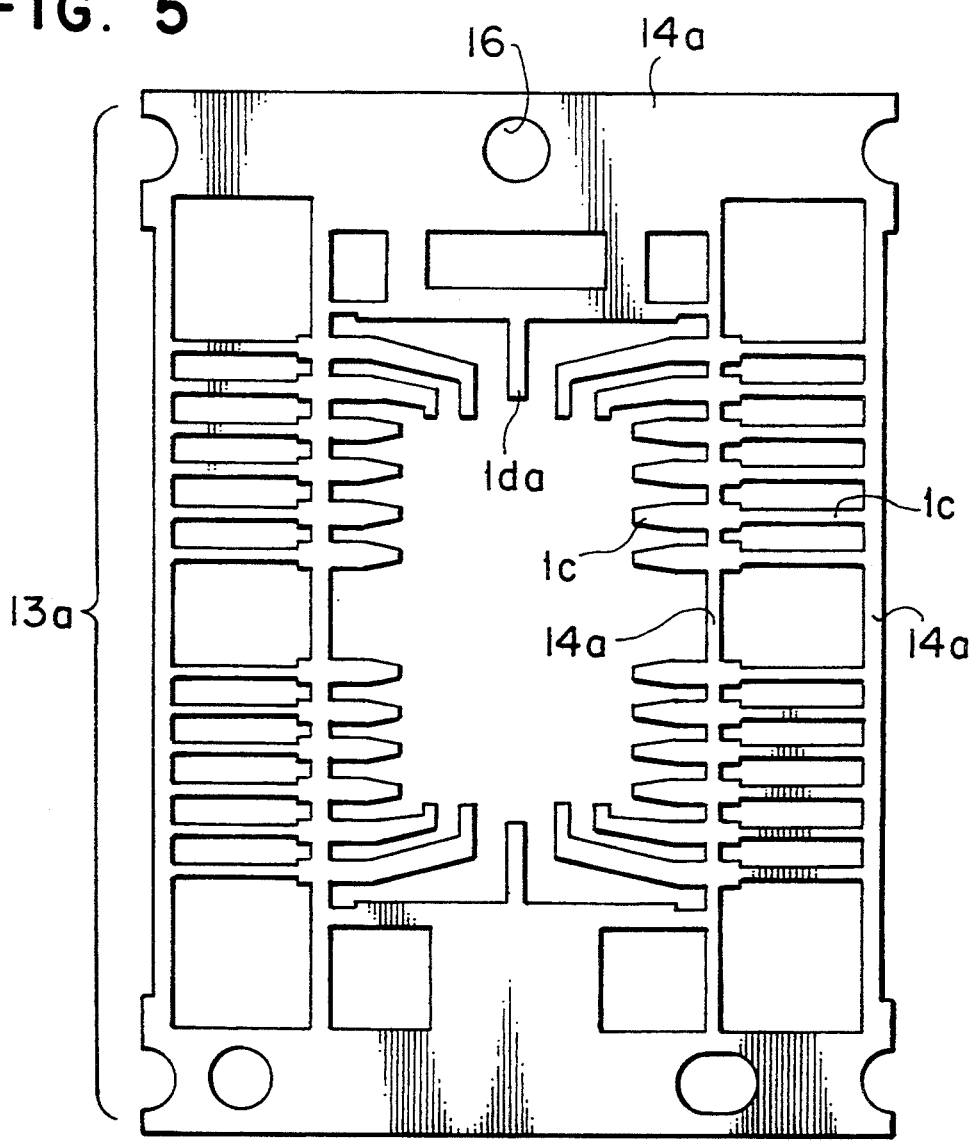
FIG. 5 is a plan view showing the form of the whole area of a leadframe corresponding to one plastic encapsulated semiconductor device.
Figure 6:
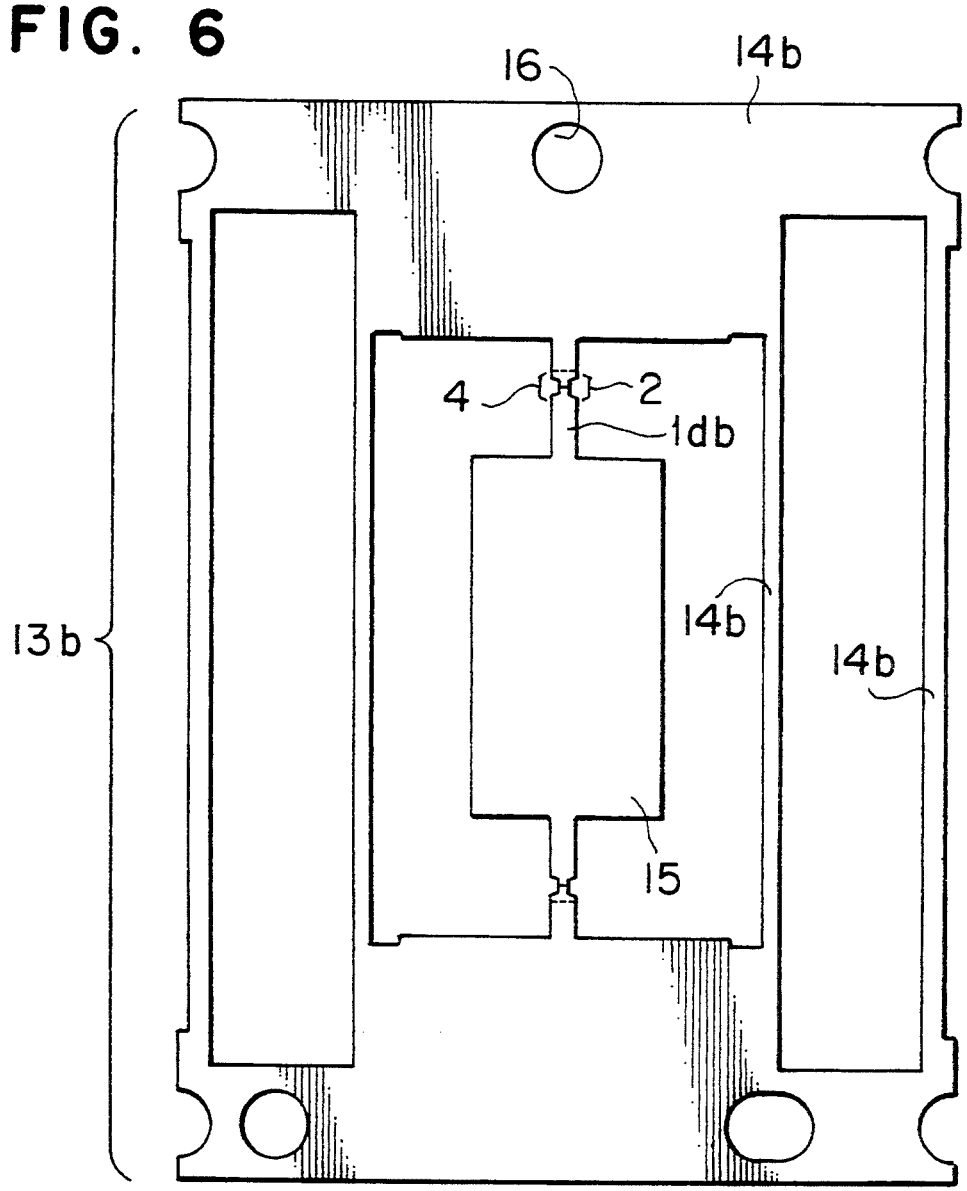
FIG. 6 is a plan view of a leadframe having a tab, showing the whole area of the leadframe corresponding to one plastic encapsulated semiconductor device.

FIGS. 5 and 6 show examples of the forms of element leadframes used as components of a final stacked leadframe. FIGS. 5 and 6 are plan views of element leadframes, showing the whole area of each frame, corresponding to one plastic encapsulated semiconductor device; leads for electric connection are formed in one leadframe and a tab 15 for mounting a semiconductor chip is formed in the other leadframe. The element leadframe 13a has leads 1c for electric connection formed inside of an outer frame 14a, and leads 1da for supporting a tab. On the other hand, the element leadframe 13b has a tab 15 formed inside of an outer frame 14b, and tab-supporting leads 1db for connecting the tab 15 to the outer frame 14b. In each of the outer frames 14a and 14b of the element leadframes 13a and 13b, guide holes 16 are provided. When element leadframes are assembled into a stacked leadframe, guide pins of an assembling jig are fitted into these guide holes 16 to position these element leadframes 13a and 13b one to the other. In the tab-supporting leads 1db of the element leadframe 13b having the tab 15, there are provided a thin portion 2 and notches 4 as shown in FIG. 1, at which tab-supporting leads 1da and 1db of the element leadframes 13a and 13b are bonded to each other and, at the same time, the outer frame 14b of the element leadframe 13b is cut off. In this way, the element leadframes can be combined each other to obtain a leadframe used for a plastic encapsulated semiconductor device having such structure as is shown in Japanese Patent Unexamined Publication No. 58-27347. This leadframe can be used to assemble a plastic encapsulated semiconductor device in a manner similar to the case where a conventional leadframe consisting of one thin sheet metal is used. That is, first, one of the surfaces of a semiconductor chip on which no circuits are formed is bonded to the tab 15 by adhesive or the like so as to fix the chip. Then, bonding pads on the other surface of the semiconductor chip where a circuit is formed are electrically connected to electric connection leads 1c by thin metal wires. Furthermore, the whole leadframe is fixed to a mold by using the outer frame 14a which has not been cut off, and is then molded with plastic. Then the remaining outer frame 14a is cut off and the portions of the electric connection leads 1c extending out of the molded plastic are bent to form desired shapes, whereby a plastic encapsulated semiconductor device is obtained.

As for a material of the leadframe, arbitrary metallic materials may be used, such as Fe—Ni-based alloys, Fe-based alloys, and Cu-based alloys, which are broadly used. In addition to combination of the same materials, suitable different materials may be used for respective element leadframes to optimize electrical, mechanical, and thermal characteristics. For example, Alloy 42 is preferable as a material for use in an element leadframe for mounting a semiconductor chip thereon, because Alloy 42 has a linear expansion coefficient similar to that of silicon used as a material for a semiconductor device to assure that the thermal stress can be reduced. On the other hand, a Cu-based alloy is preferable as a material for use in an element leadframe for making electrical connection between the inside and outside of the molded plastic, because the Cu-alloy has high electrical and thermal conductivity, to assure that good electrical and thermal characteristics can be achieved.

Forming of each part of an element leadframe, such as leads, tab, and outer frames, or forming of notches 4 can be performed by laser cutting as well as by usual conventional methods used for producing leadframes such as etching and punching. The thin portion 2 can be formed by performing etching from only one side of a lead, or by pressing leads to form recessed portions. More particularly, for example, leads of 0.1–0.5 mm thickness and 0.15–1 mm width are recessed in the thicknesswise direction and cut in the widthwise direction so that the final thicknesses and widths of the minimum cross-section of the deformed portion become 40–80% of the original dimensions. An element leadframe may have a configuration that can contain only one plastic encapsulated semiconductor device, as shown in FIGS. 5 and 6, or may comprise a plurality of the identical units connected to the unit shown in FIG. 5 or 6 at the right and left sides or at the upper and lower sides, or at all sides.

Welding and cutting can be done by using a high energy laser beam from, for example, a YAG laser or a carbon dioxide gas laser. Alternatively, instead of a laser, an optical beam from a xenon lamp and the like can be also used to obtain similar effects. Incidentally, each of the laser irradiation regions 5 shown in the drawings for explanation of the present invention represents only a main region which will be strongly irradiated and heated up to a temperature higher than the melting point of the leadframe material, and it does not contain a peripheral unintended region which might be weakly irradiated. It is not necessarily needed for the laser irradiation region 5 to have a circular form as shown in Figures, but another form such as an ellipse formed by inclined irradiation of laser beam having a circular focused spot, or other arbitrary forms such as a rectangle are also permitted. Moreover, the whole laser irradiation region 5 can be irradiated at a time with a fixed laser beam, or the laser irradiation region 5 can be melted with a small spot size of laser beam which is continuously and quickly moved across the laser irradiation region 5.

In the present embodiment, the cross section of the cutting-off portion is smaller than that of the outer portions in both thicknesswise and widthwise directions, which results in enhancement of cohesion separation of molten metal. As a result of this, it is possible to perform reliable welding and cutting at the same time. Therefore, high precision assembling of leadframes can be easily achieved without increasing the number of production steps.

Figure 7:
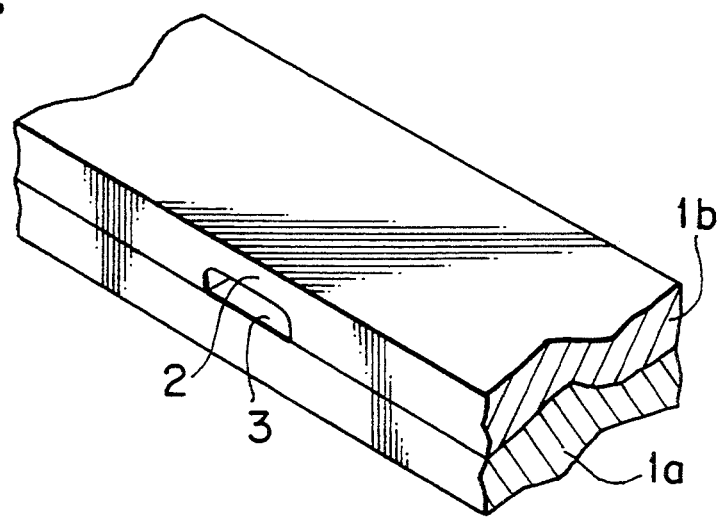
FIGS. 7-13 are fragmentary perspective views showing other embodiments of the present invention.
Figure 8:
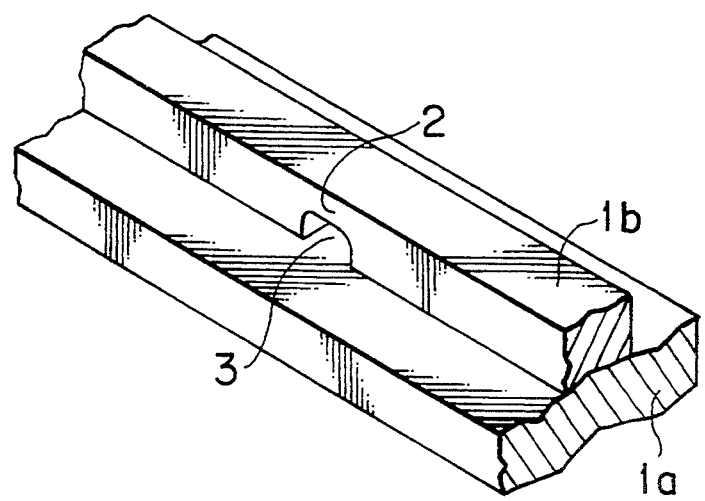

FIGS. 7 and 8 are perspective views showing the regions to be welded of element leadframes placed one upon another, for explanation of other embodiments of the methods of producing a leadframe for use in semiconductor devices embodying the present invention. In both of these embodiments, only thin portions 2 are provided in cut-off leads 1b and there are no such notches 4 as shown in FIG. 1. Even in this case, by irradiating the space regions 3 and also adjacent regions of leads 1a and 1b with a laser beam, welding occurs in the region where leads are in contact with each other, but welding is prevented in spaces 3 and melted metal coheres and separates into both sides of the thin portions 2, thus the leads are cut off. However, in these embodiments, the cross-section of the cutting-off region is reduced only in the thicknesswise direction. As a result, there is slight difficulty in cohesion and separation compared with the case where notches 4 are incorporated as shown in FIG. 1. Furthermore, in the case of FIG. 7 where both the upper and lower leads are the same in width, only the cut-off lead 1b is irradiated with a laser beam. Therefore, it is difficult to heat the non-cut-off lead 1a, so that high energy is required for welding. Moreover, because all the widthwise portions of the non-cut-off lead 1a are covered with molten metal, there is some possibility that in welding step molten metal drops from the lead and contaminates the surroundings. Nevertheless, the example of FIG. 7 has an advantage that because a large width of the cut-off lead 1b is available, the rigidity is not so reduced as in the cases of FIG. 1 and 8 and high precision positioning is possible. In the case of the embodiment shown in FIG. 8, in which the width of the cut-off lead 1b is narrower than that of the non-cut-off lead 1a, the non-cut-off lead 1a can also be heated at the same time. Furthermore, since the melting region can be limited inside the lead width, it has an advantage, compared with the embodiment of FIG. 7, that welding and cutting can be carried out using low energy without contaminating the surroundings.

Figure 9:
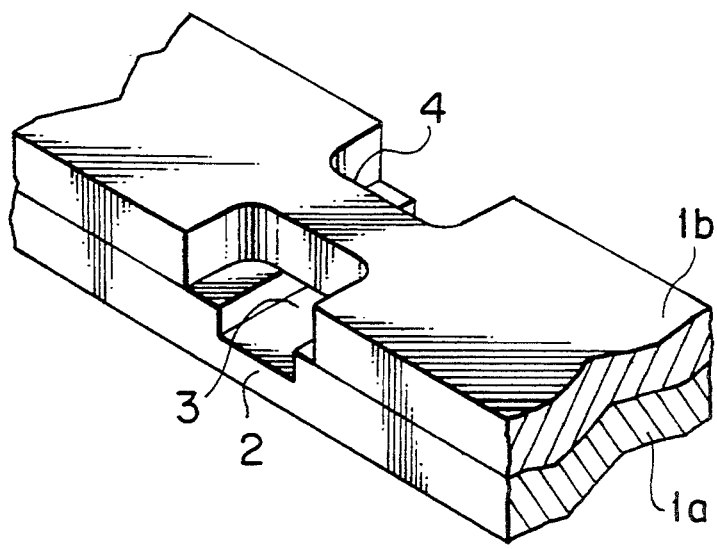

FIG. 9 is a perspective view showing the regions to be welded of element leadframes placed one upon another, for explanation of another method for producing a leadframe for use in semiconductor devices embodying the present invention. In this embodiment, notches 4 are formed in a cut-off lead 1b and a thin portion 2 is provided in a non-cut-off lead 1a. In the case of FIG. 1 where notches 4 and a thin portion 2 are both provided in the cut-off lead 1b, when the width of the non-cut-off lead 1a is not large enough, the reduction in cross-sectional area becomes so large that deformation might occur during handling or the rigidity may not be high enough to assure positioning in stacking step. The present embodiment is slightly inferior to the method shown in FIG. 1 in respect of the separation and cutting-off effect of the cohesion of molten metal, but suffers from a smaller reduction in rigidity of the cut-off lead 1b to assure a high precision positioning.

Figure 10:
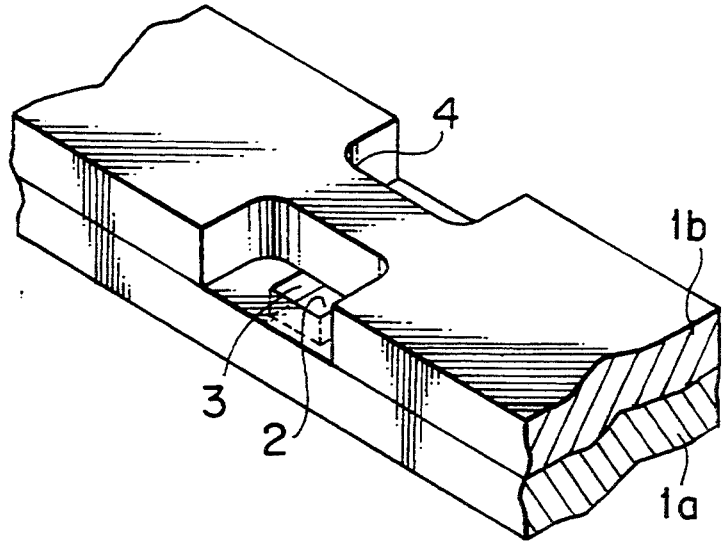

FIG. 10 is a perspective view showing the regions to be welded of element leadframes placed one upon another, for explanation of a further embodiment of the method of producing a leadframe for use in semiconductor devices embodying the present invention. In this embodiment, notches 4 are formed in a cut-off lead 1b and a thin portion 2 is provided in a non-cut-off lead 1a such that the thin portion is located in a limited area smaller than the width of the non-cut-off lead 1a. The length of the thin portion 2 in the widthwise direction of the lead may be slightly larger than the width of the cut-off lead 1b and there is no need that the thin portion 2 is provided along the whole width of the non-cut-off lead 1a. By limiting the length of the thin portion 2 as described above, the reduction in bending rigidity of the non-cut-off lead 1a can be minimized.

The method in which the thin portion 2 is formed in a non-cut-off lead 1a to minimize the reduction in rigidity of the cut-off lead 1b, as shown in FIGS. 9 and 10, can be effectively applied not only to the case where notches 4 are provided in the cut-off lead 1b but also to the case where the whole width of the cut-off lead 1b is narrowed, as shown in FIG. 6.

In above-described embodiments, there is no necessity that the thin portion 2 is formed in only one of leads; the cut-off lead 1b or non-cut-off lead 2. The thin portion 2 may be formed in both of these leads. In the case where thin portions 2 are formed in both leads, it is not required to make each lead very thin, but moderate thinning is sufficient to obtain an enough space 3. Thus, good rigidity can be achieved for both of the cut-off lead 1b and the non-cut-off lead 1a.

Figure 11:
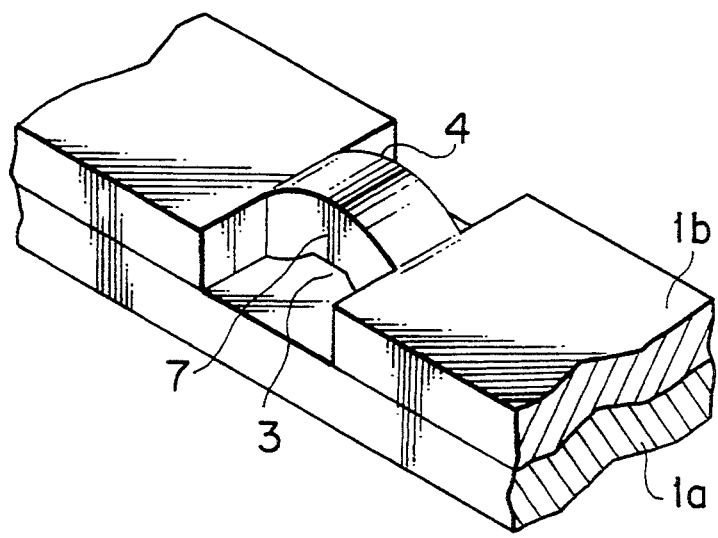

FIG. 11 is a perspective view showing the regions to be welded of element leadframes placed one upon another, for explanation of another method of producing a leadframe for use in semiconductor devices embodying the present invention. In this embodiment, by providing a bent portion 7 in a cut-off lead 1b, a space 3 is formed between the bent portion 7 and a non-cut-off lead 1a. Compared to the previous methods for forming a thin portion 2 described above, the thicknesswise reduction of the cross section is not so large, thus the reduction in rigidity of the cut-off lead 1b is small enough to obtain a high positioning accuracy, although the separation and cutting-off effects of cohesion of molten metal are slightly reduced.

Figure 12:
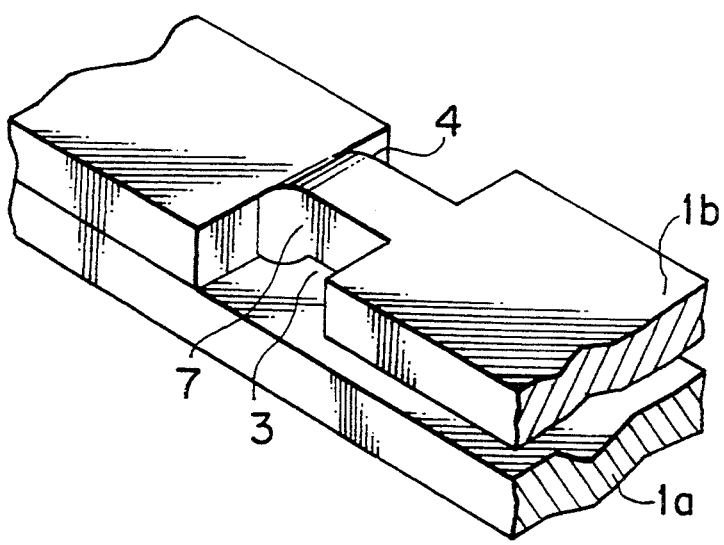

FIG. 12 is a perspective view showing the regions to be welded of element leadframes placed one upon another, for explanation of a further method of producing a leadframe for use in semiconductor devices embodying the present invention. When a space 3 is formed by providing a bent portion 7, the whole portion of a cut-off lead 1b extending from the bent portion 7 to an outer frame may be made to float above a non-cut-off lead 1a.

The method of forming a space 3 by performing bending can also be applied to the case where there are no notches 4 in a cut-off lead 1b as shown in FIGS. 7 and 8. In this case, while the reduction in area of cross-section of cut-off region is small, separation and cutting-off effect due to cohesion of molten metal in the welded portion can be also achieved.

There is no necessity that the bending is carried out for the cut-off lead 1b as in the case of FIG. 11 and 12. A similar effect can be also achieved even if the bending is carried out for the non-cut-off lead 1a or for both leads.

Figure 13:
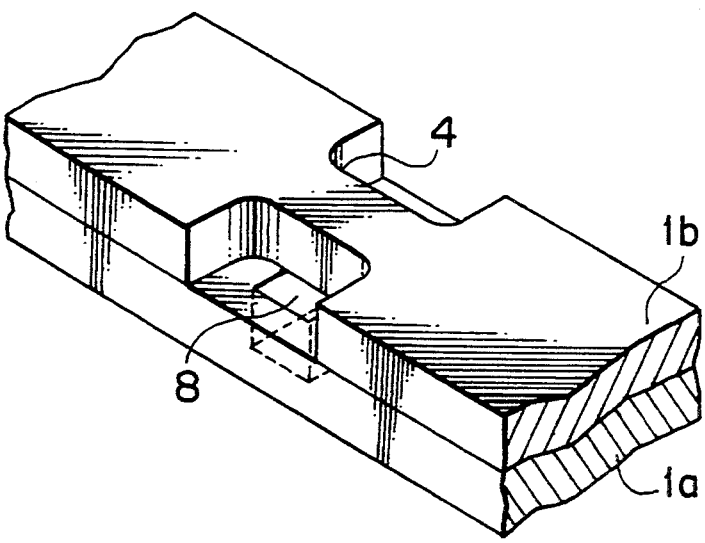

FIG. 13 is a perspective view showing the regions to be welded of element leadframes placed one upon another, for explanation of a further method for producing a leadframe for use in semiconductor devices embodying the present invention. In this embodiment, instead of providing a space between a cut-off lead 1b and a non-cut-off lead 1a, a through-hole 8 is provided in the non-cut-off lead 1a whereby the welding is prevented in this region. While there is some risk that molten metal drops through this through-hole 8, welding and cutting off can be carried out at the same time. The dimension of the through-hole 8 in the widthwise direction of the lead may be slightly larger than the width of the cut-off lead 1b disposed above the through-hole 8. In the description of the present invention, such a through-hole 8 is regarded as being embraced in the "space" 3 for preventing contact between leads.

In each of the above embodiments, two element leadframes have been described as being combined into a stacked leadframe. However, in the case where three or more element leadframes are combined into a stacked leadframe, welding and cutting-off of unnecessary portions can be carried out at the same time by repeating the similar procedure, or by simultaneously welding leads of three or more element leadframes having similar configurations.

Figure 14:
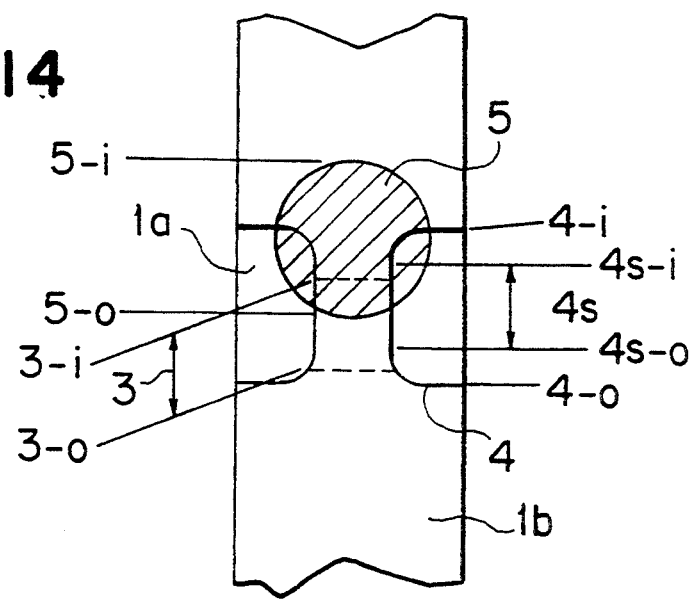
FIG. 14 is a perspective view showing overlapped leads for explanation of positioned relationship between a space, notches, and a laser irradiation region.
Figure 15:
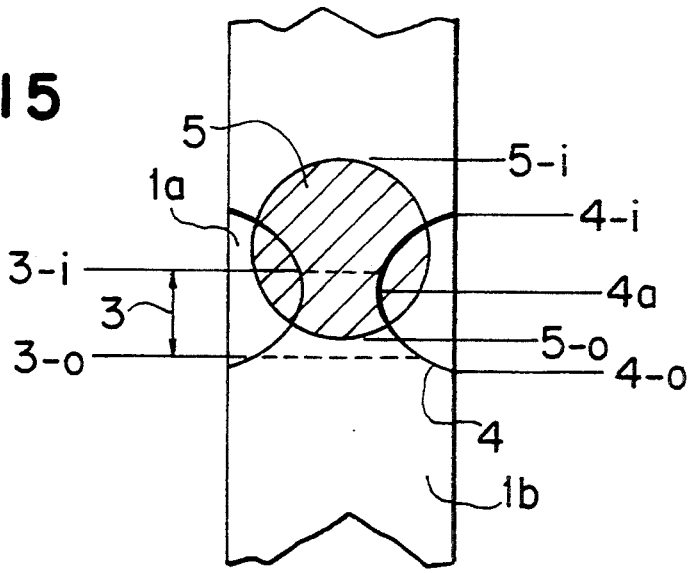
FIG. 15 is a perspective view showing overlapped leads for explanation of positional relationship between a space, notches, and a laser irradiation region.

Referring to FIGS. 14 and 15, the positional relationship between the space 3, notches 4 and laser irradiation region 5 will be described. FIGS. 14 and 15 are plan views of element leadframes which are placed one upon another for welding process. In these Figures, the lower portions of the leads extend to the outer frames of the leadframes. In FIG. 14, the notches 4 have parallel portions 4a at the location at which the lead has the minimum width, while, in FIG. 15, the lead width changes continuously. In these Figures, the ends or boundaries of the spaces 3, notches 4, and laser irradiation regions 5 are denoted by subscripts in such a way that subscript o represents the ends located adjacent the outer frames of the leadframe, and subscript i represents the other ends remote from the outer frames.

The outer end 5-o of the laser irradiation region 5 should be located at a position between the outer end 3-o of the space 3 and the inner end 3-i of the space 3 so as to prevent the portions of the leads extending from the space 3 towards the outer frame from being welded. On the other hand, the inner end 5-i of the laser irradiation region 5 should be located at a position spaced away from the inner end 3-i of the space 3 in the direction opposite to the outer frame so as to enable the portions of the leads extending from the space 3 in the direction opposite to the outer frame to be securely bonded. Moreover, the whole inner end 3-i of the space 3 or the whole width of the space 3 at the end should be included in the laser irradiation region 5.

The width of the laser irradiation region 5 should be larger than the width of the cut-off portion of the cut-off lead 1b. When the width of the non-cut-off lead 1a is larger than that of the cut-off lead 1b in the cut-off region, it is preferable that the width of the laser irradiation region 5 is smaller than the width of the non-cut-off lead 1a so as to prevent the molten metal from dropping and so as to avoid the leakage of a laser beam.

In the case where notches 4 are provided in a cut-off lead 1b, it is preferable that the lead is cut off at the position at which the lead has the minimum width. For this reason, in the case where notches 4 have parallel portions 4s as shown in FIG. 14, it is preferable that the outer end 5-o of the laser irradiation region 5 is located at a position between the outer end 4s-o of each parallel portion and its inner end 4s-i, or at a position further away from that position towards the outer frame. On the other hand, in the case where notches have no parallel portion 4s as shown in FIG. 15, it is preferable that the outer end 5-o of the laser irradiation region 5 is located at a position outwards from the position 4a at which the lead has the minimum width. To obtain sufficient cohesion effect of molten metal at the wide lead portion adjacent to the cut-off region, the inner end 5-i of the laser irradiation region 5 should be located at least at a position away from the inner end 4s-i of the parallel portion in the direction opposite the outer frame in the case where the notch 4 has a parallel portion 4s as shown in FIG. 14, and at a position away from the position 4a at which the lead has the minimum width in the direction opposite the outer frame or more preferably away from the inner end 4-i of the notch in the direction opposite the outer frame in the case where the notch has no parallel portion 4s.

Consideration of the outer end 5-o of the laser irradiation region 5 shows that, compared with the case where the outer end 5-o of the laser irradiation region is located at a place within the parallel portion 4s, it is more preferable that the outer end 5-o of the laser irradiation region 5 is located so that the laser irradiation reaches slightly outer region beyond the outer end 4s-o of the parallel portion as shown in FIG. 2 to enhance the effect of cohesion towards the outer frame. As a consequence, a shorter length of the parallel portion 4s of each notch 4 can give better effect of cohesion to both sides of the cut-off region. Therefore, the shape of the notch by which the lead width is changed continuously as shown in FIG. 15 is more preferable than the other.

As described earlier, in order to cut off leads at the position at which the leads have the minimum widths, it is also necessary to carefully consider the positional relationship between the space 3 and the notch 4. A preferable position of the inner end 3-i of the space is between the outer end 4s-o of the parallel portion and the inner end 4-i of the notch in the case where the notch 4 has a parallel portion 4s as shown in FIG. 14. In the case of the notch 4 having no parallel portion as shown in FIG. 15, a position between the position 4a at which the lead has the minimum width and the inner end 4-i of the notch is preferable. On the other hand, in order to obtain a good bonding reliability of the welded portion, it is preferable that leads are in contact with each other over the possible largest area prior to the welding step. Therefore, for the notch 4 having no parallel portion as shown in FIG. 15, the inner end 3-i of the space should preferably be located at a position which is as close as possible to but slightly apart, in the direction opposite the outer frame, from the position 4a at which the lead has the minimum width.

For the case of a notch 4 having a parallel portion 4s as shown in FIG. 14, it is preferable that the outer end 3-o of the space is located at a position which is apart, in the direction toward the outer frame, from the outer end 4s-o of the parallel portion of the notch 4. For the case of a notch 4 having no parallel portions as shown in FIG. 15, the outer end 3-o of the space should preferably be located at a position which is apart, in the direction toward the outer frame, from the position 4a at which the lead has the minimum width. Furthermore, the outer end 3-o of the space may be located at a position which is apart, in the direction towards the outer frame, from the outer end 4-o of the notch as in the embodiment shown in FIG. 1. Still furthermore, the space 3 may be formed by the whole portion of the lead extending from the inner end 4-i of the notch toward the outer frame as in the case of FIG. 12.

Figure 16:
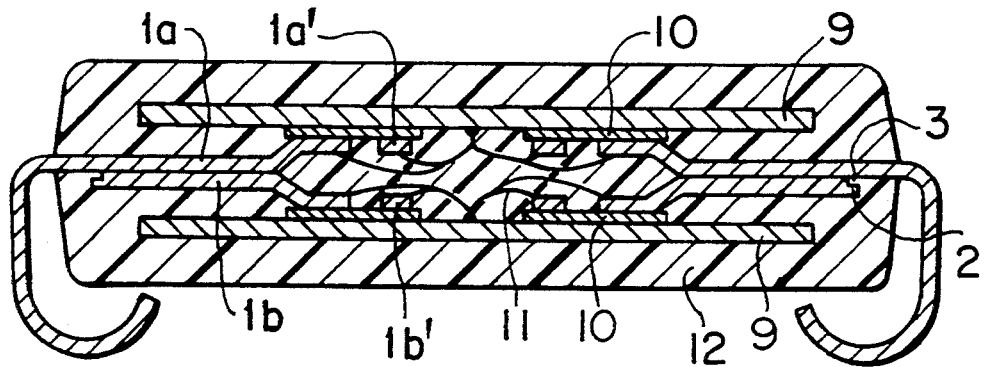
FIG. 16 is a cross sectional view of an embodiment of a plastic encapsulated semiconductor device produced by using a method for producing a leadframe for semiconductor device in accordance with the present invention.

FIG. 16 is a cross-sectional view of an embodiment of a plastic encapsulated semiconductor device produced by using a method of producing a leadframe for use in semiconductor devices described above. The surfaces, on which circuits are formed, of two semiconductor chips 9 are bonded to a plurality of leads 1a and 1b, respectively, via insulating films 10. The leads 1a and 1b are electrically connected via thin metal wires 11 to electrodes provided along the center lines on the surfaces of the chips on which the circuits are formed. The leads 1a and 1b include common leads 1a' and 1b' provided along the pads on the circuit-formed-surfaces of the semiconductor chips 9 in the direction perpendicular to the cross-section shown in FIG. 16. These common leads 1a' and 1b' are used for supplying source voltages and reference voltages to various portions of the semiconductor chips 9. The semiconductor chips 9 are placed so that their circuit-formed-surfaces are directed towards each other. The lead 1b is connected to the lead 1a at zones outside the region where the circuit-formed-surfaces of the semiconductor chips face each other. Furthermore, all these members except the portions of the leads 1a extending outside are encapsulated with a plastic 12. The outer leads, or the portions of leads 1a extending outside, include leads which are connected in common to both semiconductor chips 9 inside the plastic 12, and also include leads which are electrically connected only to either one of these two semiconductor chips 9. In such a construction of a plastic-encapsulated semiconductor device, for example, when two memory chips having the same circuit structure are used as semiconductor chips 9, an external dimension corresponding to approximately only one semiconductor device can integrate with twice the memory capacity.

Figure 17:
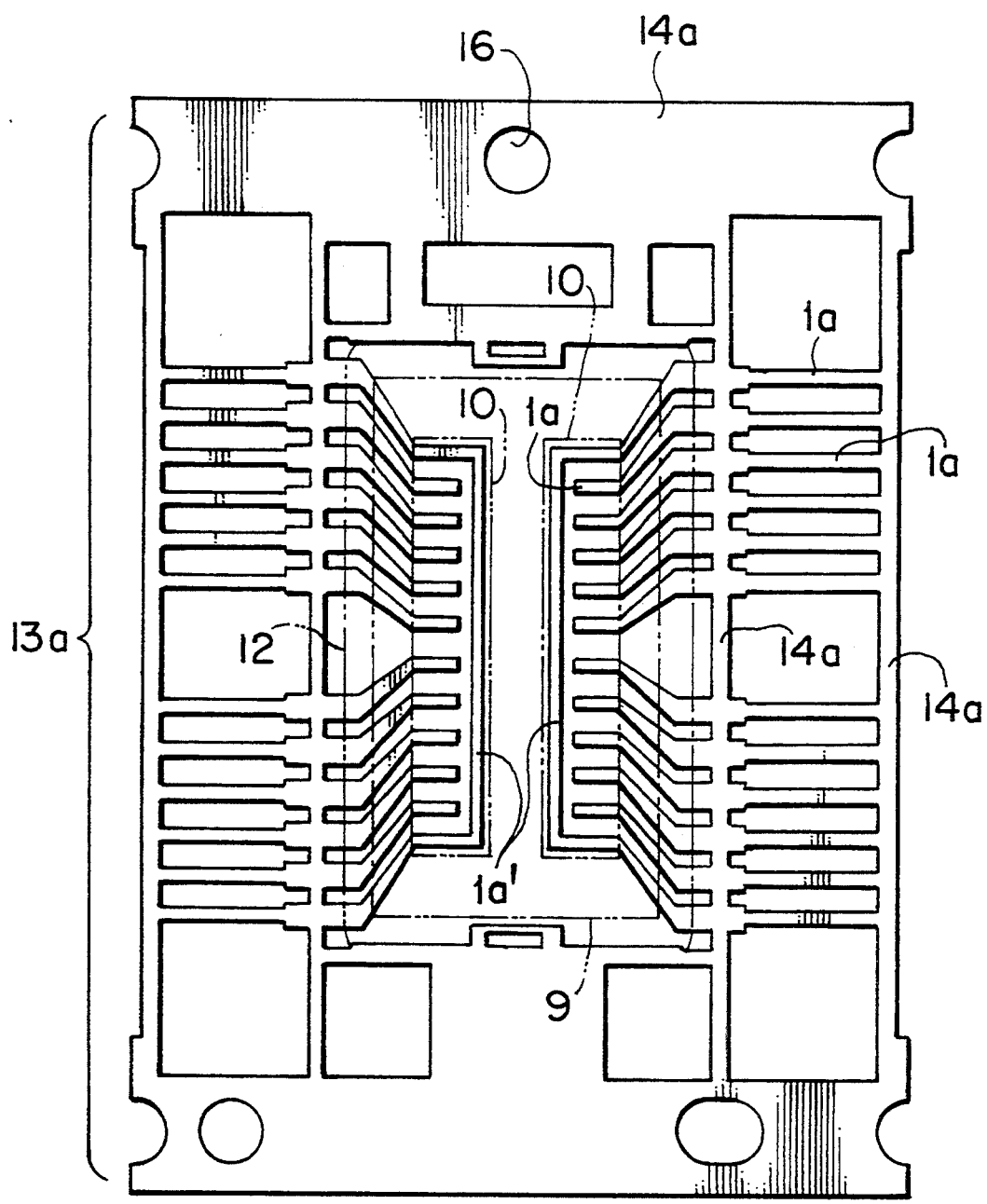
FIG. 17 is a plan view showing the whole area of an element leadframe corresponding to one plastic encapsulated semiconductor device.

To assemble a plastic-encapsulated semiconductor device as shown in FIG. 16, two different element leadframes corresponding to two semiconductor chips are prepared and a plurality of leads 1a are formed on one of these element leadframes while a plurality of leads 1b are formed on the other element leadframe. FIG. 17 shows a plan view of an element leadframe 13a in which leads 1a are formed. In FIG. 17, the area corresponding to one plastic-encapsulated semiconductor device is shown. As far as the portions which will remain inside the plastic 12 are concerned, an element leadframe 13b in which leads 1b are formed also has a shape similar to that shown in FIG. 17 except for the portions for the connection. Element leadframes 13a and 13b have outer frames 14a and 14b, respectively, by which a plurality of leads 1a and 1a' or 1b and 1b' are connected to each other and supported. Thin portions 2 are provided in the leads 1b so that spaces 3 are formed when the leads 1b are combined with the leads 1a in the stacked form.

In the assembling step, semiconductor chips 9 are attached to respective element leadframes 13a and 13b via insulating films 10, and electrically connected to the leads by thin metal wires 11. Then, two element leadframes 13a and 13b having semiconductor chips 9 attached thereto are placed one upon another using guide holes 16 provided in their outer frames 14a and 14b for positioning. The region of each lead 1b extending from the space 3 to the inner contacting portion is irradiated with a laser beam so as to weld the laser irradiation regions inwards of the space 3 of-leads 1a and 1b, and to simultaneously cut off the portion of the lead 1b outwards of the space 3 of the lead 1b. The leadframe assembled in this way is fixed in a mold and molded or encapsulated with a plastic 12. Then, the outer frame 14a connected to the leads 1a is cut off. The portions of the leads 1a extending outwards of the molded plastic are bent into shapes such as J-bent, gull-wing and butt types for surface mounting, and other lead types for pin-through-hole mounting.

In accordance with the present invention, a plurality of large size semiconductor chips which have little tolerance in dimension can be mounted at accurate positions inside a small molded plastic. Moreover, connection and cutting-off of leads can be carried out at the same time. As a consequence, high integration density semiconductor devices can be assembled with high productivity.

What is claimed is:

1. A plastic molded semiconductor device comprising:

a mass of a plastic material;

a pair of semiconductor chips disposed in said mass of plastic material and in spaced relationship with each other so that circuit-formed surfaces of said semiconductor chips are directed towards each other;

at least one set of leads comprising first and second leads;

each of said first and second leads having an inner section disposed in said mass of plastic material between said semiconductor chips and an outer section integral with and extending from said inner section also disposed in said mass of plastic material and extending from an area of an associated semiconductor chip toward an outer surface of said mass of plastic material;

a length of metal wire disposed in said mass of plastic material for electrically connecting each of said first and second leads to an associated semiconductor chip;

the outer section of said first lead extending in overlapping and face-to-face contacting relationship with the outer section of said second lead and having an outer end extremity welded to the outer section of said second lead; and the outer section of said second lead having an outer extension extending outwardly from said mass of plastic material.

2. A plastic molded semiconductor device according to claim 1, wherein the inner sections of said first and second leads are spaced away from each other and towards associated semiconductor chips and a layer of an insulating material is disposed between the inner section of each of said first and second leads and an associated semiconductor chip.

3. A plastic molded semiconductor device according to claim 2, wherein said length of metal wire extends between and is connected to the inner section of each lead and the associated semiconductor chip.

4. A plastic molded semiconductor device according to claim 2, wherein each of said semiconductor chips has a plurality of electrodes arranged in a row on the circuit-formed surface of the semiconductor chip and wherein a plurality of sets of leads are arranged in two substantially parallel and spaced rows and two pairs of common leads disposed between said semiconductor chips and extending substantially parallel to the rows of the sets of leads, and each pair of said common leads comprising two common leads each extending in substantially parallel relationship with and electrically connected to the row of the electrodes of the associated semiconductor chip.

* * * * *